Aug. 17, 1965 J. M. MASON ETAL 3,201,695
AM-FM ALL TRANSISTOR RADIO RECEIVER
Filed Oct. 1, 1962
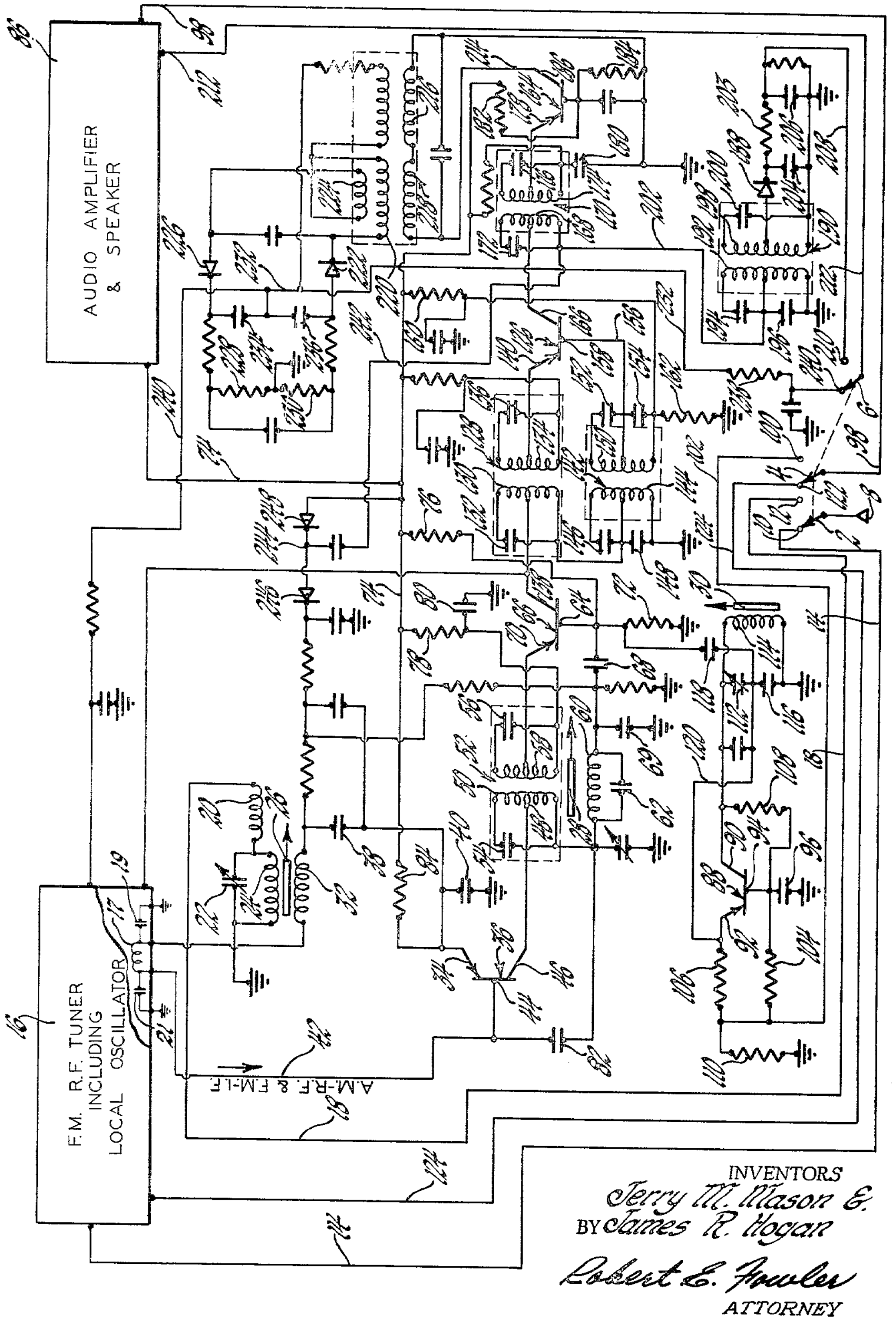
INVENTORS
Jerry M. Mason &
BY James R. Hogan
Robert E. Fowler
ATTORNEY

United States Patent Office 3,201,695
Patented Aug. 17, 1965

3,201,695

AM-FM ALL TRANSISTOR RADIO RECEIVER

Jerry M. Mason and James R. Hogan, Kokomo, Ind., assignors to General Motors Corporation, Detroit, Mich., a corporation of Delaware Filed Oct. 1, 1962, Ser. No. 227,402
7 Claims. (Cl. 325—315)

This invention relates to radio receiving apparatus and more particularly to a combination radio receiver capable of receiving and translating either amplitude modulated (AM) or frequency modulated (FM) signals into audible sound waves and is an improvement over the combination AM-FM circuit shown in Serial No. 141,189, filed September 27, 1961 in the name of Jerry M. Mason and assigned to a common assignee.

The increase in the number of frequency modulated transmitters and the excellence of the programs that they have put on the air have created an increased market for FM receivers. Since the range for reception of FM signals is limited, whereas AM signals may be received over great distances, combination sets which are capable of receiving either AM or FM signals are becoming popular. Especially in automotive receivers where the locale of operation constantly changes it is advantageous to be able to receive AM signals at long distances from the transmitting stations when the car is operated in remote areas and which is also capable of receiving FM signals when the car is being operated in urban areas in proximity to excellent FM programs.

It is, therefore, an object in making this invention to provide a combination AM and FM receiver.

It is a further object in making this invention to provide a combination AM-FM radio receiver in which the intermediate frequency (IF) amplifying section operates for either FM or AM mode of transmission without mechanical switching.

It is a further object in making this invention to provide an IF amplifying section for either AM or FM mode of operation that functions as a common base amplifier type for FM reception and as a common emitter type for AM reception without mechanically switching.

It is a still further object in making this invention to provide a combination AM-FM radio receiver having a combined AM-RF and FM-IF amplifying stage that functions for either type reception without mechanical switching.

With these and other objects in view which will become apparent as the specification proceeds, our invention will be best understood by reference to the following specification and claims and the illustrations in the accompanying drawing, in which:

The figure is a circuit diagram including block diagrams of a radio receiver embodying our invention.

Referring now more particularly to the drawing, there is shown therein a complete radio receiver which is capable of receiving and translating either AM or FM signals. The mechanical switch which is operated to change the receiver from AM to FM operation includes only three switching arms which provide the following functions. The first arm switches the antenna from the input to the RF amplifier for the FM portion and to the RF amplifier for the AM portion; the second arm switches the local oscillator either in or out of circuit, and the third or last arm switches the output from the FM or AM detector into the common audio amplifier and speaker section. This is the only switching that is required in the operation of the receiver. The switch is shown in the lower central portion of the drawing and includes arms 2, 4 and 6 which perform the functions above mentioned and which are physically connected together for ganged movement. Movable switch arm 2 is permanently connected to the antenna 8 which may be an automotive antenna and this arm may engage either stationary contact 10 or 12. Contact 10 is connected through line 14 to the input of the FM-RF tuner section indicated by the block diagram 16 inasmuch as this portion of the receiver is conventional and forms no part per se of our invention. The other stationary contact 12 is connected through line 18 and a radio frequency choke coil 20 to the tuned circuit for the first radio frequency amplifying stage of the AM tuner. This tuned circuit includes an adjustable condenser 22 in parallel with a tuning coil 24 connected between one terminal of the choke coil 20 and ground. The inductance of the coil 24 may be changed for tuning purposes by a movable comminuted core 26 which is moved simultaneously with two other cores 28 and 30 which tune the RF and local oscillator, respectively. These particular cores are used to tune the AM section. There are also similar tuning means provided in the FM tuner 16 which is moved simultaneously with these cores to tune the FM portion but not shown in detail since they are in the block portion 16.

Inductively associated with the tuning coil 24 is a secondary winding 32 which is coupled to the base electrode 44 of transistor 36 in series with FM-IF transformer secondary 17. Capacitor 19 is an FM-IF bypass and in conjunction with capacitors 21 and 22 tunes inductor 24 to the incoming AM radio frequency. Thus the AM-RF signal is applied to the transistor 36 which acts as the first RF amplifying stage. A bypass condenser 40 is connected between the emitter 34 and ground. This stage including transistor 36 also acts as the first IF amplifier for the FM signal and, therefore, the output of the FM-RF tuner 16 is connected through line 42 directly to the base electrode 44 of the transistor 36. The collector electrode 46 of the transistor 36 is connected directly to tap 48 on primary winding 50 of the coupling transformer 52. A condenser 54 is connected across the primary winding 50 to tune this section to the FM intermediate frequency of 10.7 megacycles. Similarly a further condenser 56 is connected across the secondary winding to tune it to the same frequency as the primary. The RF tuning for the AM operation is provided by changing the inductance of tuning coil 60 connected to the collector 46 through primary 50. The coil 60 has connected in shunt therewith a condenser 62. The tuning of this coil is obtained by movement of a comminuted core 28 indicated just above the same. The signal from this tuned section is injected into the base electrode 64 of transistor 66 through coupling condenser 68. The AM signal, therefore, is applied from the collector 46 through the lower half of primary 50 and to the tuning coil 60, thence through the coupling condenser 68 and injected at the base 64. On the other hand when this stage acts as an IF amplifier for FM operation the signal is applied from the collector 46 to the primary winding 50 where it induces a current in the secondary winding 58 of the transformer 52 which signal is then applied to the emitter 70 of the transistor 66. The base 64 of the transistor 66 is connected to ground through biasing resistor 72 and to the main A power line 74 through resistance 76. The base 64 of transistor 66 is provided with a low impedance path to ground for FM-IF frequencies through the series combination of capacitors 68 and 69. Consequently this stage acts as a common base amplifier for FM-IF without switching. The lower terminal of the secondary winding 58 of transformer 52 is likewise connected to the power line 74 through a resistance 78 and bypassed to ground through condenser 80.

A condenser 82 is connected to the lower terminal of the primary winding 50 of the transformer 52 and also to the base electrode 44 of the transistor 36. This condenser performs two different very important functions, one for each type of operation. During FM operation when the stage is acting as an intermediate frequency amplifier the condenser 82 provides a feedback path for out-of-phase voltage from the output back to the input. This feedback or neutralization cancels out undesired feedback effects in the transistor. On the other hand, during operation as an AM-FM amplifier it acts to smooth the RF overload characteristic for the RF frequency stage. These are two different functions of operation and are accomplished by the single component without switching.

Power line 74 is also connected to emitter 34 through resistance 84. The actual power line connection is made in the audio amplifier portion of the set and, therefore, does not appear as a separate A line connection. Since the audio amplifier and speaker portion of the receiver is conventional and forms per se no part of the present invention, it has been shown in block diagram form at 86.

Transistor 66 acts as an IF amplifying stage for the FM signals and as a mixer stage for the AM signals. It is, therefore, necessary to provide a source of local oscillation which in this case includes a transistor 88 having a collector 90, an emitter 92 and a base 94. The base electrode 94 is connected to ground through a condenser 96. The power line for supplying this section is line 98 which runs from the block 86 indicating the audio amplifier and speaker to switch arm 4. When switch arm 4 is in its righthand position for AM operation it engages stationary contact 100. Line 102 connected to stationary contact 100 is connected to various biasing resistances 104, 106, 108 and 110 all of which provide the necessary voltages for the transistor 88. The tuned circuit for the oscillator includes adjustable condenser 112, inductance 114 and a fixed condenser 116 which circuit may be tuned by the movement of comminuted core 30 which moves in unison with the other cores 28 and 26 to tune the set during AM operation. The output of the oscillator is coupled through condenser 118 directly to the base 64 of transistor 66. A feedback line 120 applies an oscillating signal to the emitter 92 to maintain oscillatory action. When ganged switch arm 4 contacts its second stationary contact 122 on the lefthand side it provides a source of power to line 124 which in turn runs to the FM tuner portion and thus energizes that section during FM operation.

The output of the transistor 66 is, therefore, an intermediate frequency signal for either FM or AM operation. For FM operation the frequency of the intermediate frequency signal is 10.7 megacycles, whereas for AM operation the intermediate frequency signal is 262.5 kilocycles. The section is capable of differentiating between these two frequencies without mechanical switching. There are two coupling transformer sections coupling the output of transistor 66 to the input of the next transistor 126. The upper transformer 128 has its primary winding 130 tuned by condenser 132 connected thereacross to the FM intermediate frequency and its secondary winding 134 tuned by condenser 136 to the same frequency. Collector 138 of transistor 66 is connected directly to a tap on primary winding 130 and emitter 140 is in like manner connected to a tap on secondary winding 134. Thus when the receiver is operating on FM signals the FM intermediate frequency will be transmitted directly from the collector 138 through the tuned coupling transformer 128 to the emitter 140 of transistor 126. The path for the AM-IF signal is through the lower transformer 142, in this case the primary winding 144 has two condensers 146 and 148 connected thereacross in series. A center tap on the primary winding 144 and a central point between the two condensers 146 and 148 is connected to the lower terminal of primary winding 130 on transformer 128. Secondary winding 150 is similarly connected having two condensers 152 and 154 connected thereacross in series and its center tap and an intermediate point between the condensers 152 and 154 is connected by a line 156 to the base electrode 158 of the transistor 126. The lower terminal of the primary winding 144 is connected to ground. The power line 74 is connected through a voltage divider including resistances 160 and 162 in series to ground. The lower terminal of the secondary winding 150 of transformer 142 is connected to a point intermediate the two resistances to provide a proper bias for the base. It is thus evident that the intermediate frequency FM signals are applied to the emitter 140, whereas the intermediate frequency AM signals are applied to the base 158 of transistor 126.

From the output of the amplifying stage including transistor 126 the FM signals pass through one additional step of amplification which is provided for by transistor 164. Therefore, the collector 166 of transistor 126 is connected to a tap on the primary winding 168 of a transformer 170 which is tuned to the FM intermediate frequency of 10.7 megacycles by condenser 172 connected thereacross. The secondary winding 174 of the same transformer is also tuned by a condenser 176 and its tap connected directly to emitter 178 on the transistor 164. The lower terminal of the secondary winding 174 of the transformer is bypassed to ground through condenser 180. A voltage divider consisting of two resistances 182 and 184 in series are connected between the power line 74 and ground to apply biasing potentials to the transistor 164. Thus in FM operation amplified FM signals appearing at the output of transistor 126 are applied for further amplification to emitter 178 of transistor 164. Here they are further amplified and the collector 186 of the transistor 164 then applies these signals to a ratio detector section for detection.

On the other hand, any AM-IF signals instead of passing through to this additional stage of amplification are instead detected by the detector diode 188. They are applied thereto by additional tuned circuits including a transformer 190 whose primary winding 192 is tuned to the AM-IF frequency of 262.5 kilocycles by two condensers 194 and 196 connected thereacross in series. Capacitor 196 having negligible impedance to the 10.7 megacycle IF also provides an A.C. ground path for primary 168 of transformer 170. A secondary winding 198 is likewise tuned to the same frequency by a single condenser 200 connected in shunt thereto. A center tap on the primary winding 192 and a central point between condensers 194 and 196 is connected through conductor 202 with the lower terminal of primary winding 168 of transformer 170. Thus any AM-IF signals of this frequency are conducted directly to the tuned transformer 190 and pass therethrough to be detected by the diode 188. The output of the diode is filtered by a low pass filter circuit consisting of resistance 203 and two condensers 204 and 206 connected from either end of the resistance to ground. The output of the filter is connected through line 208 to stationary contact 210 which cooperates with movable switch arm 6 of the gang switch 2–4–6. This line 208 applies the AM signal to this point and when contact 210 engages movable contact 6 the detected AM signal is applied to line 212 to be fed to the audio amplifier and speaker for further audio amplification and translation into audible signals.

The output of the last stage of IF amplification for FM appears on line 214 which is connected to collector 186 of transistor 164. This line feeds into primary 216 of the coupling transformer 218 for the ratio detector. The secondary winding 220 has one terminal connected directly to diode 222 and the center tap connected through a tickler coil 224 to the second diode 226. These two diodes develop the detected FM signal across resistors 228 and 230 in the conventional manner for ratio detector action and this signal is applied to line 232 from a point between condensers 234 and 236 which are connected in series across the resistances as the frequency is modulated. Line 232 extends through a limiting resistor 238 to stationary contact 240 which is associated with movable switch arm 6. Thus when the movable switch arm 6 is in the position shown the detected FM signal is applied to line 212 and further amplified in the audio amplifier and applied to the loud speaker.

It is to be noted that there are no mechanical switching arrangements for the IF section including transformer 128 and transistor 126. The primary winding 130 of the FM transformer 128 is provided with a high frequency bypass through condenser 148 which is one of the condensers connected across the primary 144 in the AM transformer portion. Thus this condenser acts as part of the capacitance of the primary of the AM transformer for tuning and at the same time as a high frequency bypass for the FM portion. The base of the transistor 66 is bypassed for high frequency signals through condensers 68, 69, 116 and 118. Here again these condensers are used for bypassing for the FM frequencies where they are used for coupling capacitors when AM signals are being amplified. From the secondary winding 134 of the FM transformer 128 the signal is fed to the emitter 140 of the transistor 126 which is operated as a grounded base amplifier when amplifying FM signals. The base 158 is bypassed for 10.7 megacycles by condenser 154 which is also used as a part of the tuned circuit capacitance of the secondary 150 of the AM intermediate frequency transformer 142. The 10.7 megacycle FM intermediate frequency is amplified by transistor 126 exactly as it was by transistor 66 and fed to the next transformer 170 for further amplification. Thus when operated to amplify AM signals both transistors 66 and 126 will operate as common emitter stages with the FM intermediate frequency transformers 52, 128 and 170 appearing only as very low impedances at the AM intermediate frequency of 262.5 kilocycles per second. The AM intermediate frequency signal will appear on the base 64 of transistor 66 and will be amplified by it and fed through the low impedance of FM transformer 128 to the primary of the AM intermediate frequency transformer 142. This transformer is double tuned to 262.5 kilocycles per second. The AM-IF signal then appearing in the secondary 150 is fed to the base 158 of the transistor 126. Thus the various condensers specifically referred to in the AM circuits are used as high frequency bypass elements for FM operation and coupling elements for AM operation.

An automatic frequency control signal is developed at the ratio detector and applied through line 240 to the RF tuner. An automatic gain control signal is developed at the tap of primary 192 of transformer 190 and applied through line 202 and thence through line 242 to a point 244 intermediate diodes 246 and 248 which are connected to the main power line to develop a signal which can be fed back to the emitter 34 of the first stage for controlling gain.

When the gang switch 2–4–6 is in the position shown the receiver is in condition for receiving FM signals. The antenna 8 is connected by movable switch arm 2 to the input of the FM-RF tuner 16, the local oscillator 88 is deenergized and the RF tuner is energized through connection by switch arm 4 to the power line 98 and switch arm 6 of the gang switch connects the output of the FM detector to the audio amplifier and speaker. The set will, therefore, operate as described to receive and detect frequency modulated signals. If the switch is operated so that the contacts move to the righthand position the antenna 8 will be switched so that it now feeds into the input for the first transistor 36 which acts as the first RF-AM amplifier. The movement of the switch arm 4 deenergized the FM tuner and in turn energizes the local oscillator 88 and the switch arm 6 in its righthand position connects the output of the AM detector 188 to the audio amplifier and speaker 86.

What is claimed is:

1. In combination AM-FM radio receiving apparatus having an antenna, a tunable antenna circuit connectible thereto for AM signals, and an FM-RF tuning means developing an intermediate frequency modulated signal alternately connectible to said antenna, a single electronic amplifying stage connected to both the FM-RF tuning means and to the tunable antenna circuit for the AM-RF signals to amplify either the FM-IF signals or the AM-RF signals, said electronic amplifying stage including a transistor having an input and an output circuit, said input circuit being connected to the FM-RF tuning means and to the tunable antenna circuit for the AM signals, capacitance feedback means connected between the input and output circuits of the transistor to provide different functions for AM or FM modes of operation and additional amplifying means connected to the transistor output circuit.

2. In combination AM-FM radio receiving apparatus having an antenna, a tunable antenna circuit connectible thereto for AM signals, and an FM-RF tuning means developing an intermediate frequency modulated signal alternately connectible to said antenna, a single electronic amplifying stage connected to both the FM-RF tuning means and to the tunable antenna circuit for the AM-RF signals to amplify either the FM-IF signals or the AM-RF signals, said electronic amplifying stage including a transistor having a base, emitter and collector electrode, said base electrode being connected to the tunable antenna circuit for AM signals and to the FM-RF tuning means so that either AM-RF signals or FM-IF signals may be impressed on the transistor, additional amplifying means connected to the collector electrode to amplify the output of the single electronic stage and capacity feedback means connected between the collector and base electrodes to smooth out AM-RF overload characteristics when this stage is operated to amplify AM signals and to provide neutralizing feedback to cancel out undesired feedback effects in the transistor when the stage is operating to amplify FM signals.

3. In combination AF-FM radio receiving apparatus having an antenna, a tunable antenna circuit connectible thereto for AM signals, and an FM-RF tuning means developing an intermediate frequency modulated signal alternately connectible to said antenna, a single electronic amplifying stage connected to both the FM-RF tuning means and to the tunable antenna circuit for the AM-RF signals to amplify either the FM-IF signals or the AM-RF signals, said electronic amplifying stage including a transistor having a base, emitter and collector electrode, said base electrode being connected to the tunable antenna circuit for AM signals and to the FM-RF tuning means so that either AM-RF signals or FM-IF signals may be impressed on the transistor, additional amplifying means connected to the collector electrode to amplify the output of the single electronic stage and capacity feedback means connected between the collector and base electrodes to smooth out AM-RF overload characteristics when this stage is operated to amplify AM signals and to provide neutralizing feedback to cancel out undesired feedback effects in the transistor when the stage is operating to amplify FM signals.

4. In combination FM-AM radio receiving apparatus having independent AM and FM radio frequency tuning and mixing means to produce IF signals of different frequencies, common IF amplifying means connected to the independent AM and FM radio frequency tuning and mixing means to amplify the intermediate frequency waves produced by either AM or FM reception including a plurality of channels tuned to different frequencies, said common IF amplifying means including at least one transistor having a base, emitter and collector electrode so connected to the AM and FM radio frequency tuning and mixing means as to operate in common base mode in amplifying FM intermediate frequency waves and in common emitter mode in amplifying AM intermediate frequency waves with no mechanical switching and an output circuit connected to the collector electrode.

5. In combination AM-FM radio receiving apparatus having an antenna, a tunable antenna circuit connected thereto for AM signals, an FM-RF tuning means including a local oscillator, alternately connectible to the antenna, an amplifying stage including a transistor having a base, emitter and collector electrode, means for connecting said base electrode to the tunable antenna circuit for AM signals, means for connecting said emitter electrode to the FM-RF tuning means for applying an FM-IF signal thereto, a separate tunable local oscillator connected to the base electrode of the transistor to provide a difference frequency to mix with the AM-RF signals and produce an AM-IF signal in this amplifying stage, said stage operating in a common base mode for amplifying FM signals and in a common emitter mode for amplifying and mixing AM signals and an output circuit connected to the collector electrode for both AM and FM-IF signals.

6. In combination AM-FM radio receiving apparatus having an antenna, an FM-RF tuner connectible thereto including an oscillator to reduce the FM signal to a lower IF frequency, and an AM-RF amplifier, a combination mixer and IF amplifier stage including a transistor having a base, emitter and collector electrodes, conductive means connecting the FM tuner with the emitter electrode to inject FM-IF signals, second conductive means connecting the AM-RF amplifier to the base electrode to introduce AM-RF signals thereto, a separate oscillator connected to said base electrode to provide waves to beat with the AM-RF signals and produce an IF signal, said combination stage operating as a common emitter stage during AM operation and as a common base stage during FM operation without any mechanical switching, and an output circuit connected to the collector electrode.

7. In combination AM-FM radio receiving apparatus having an antenna, an FM-RF tuner connectible thereto including an oscillator to reduce the FM signal to a lower IF frequency, and an AM-RF amplifier, a combination mixer and IF amplifier stage including a transistor having a base, emitter and collector electrodes, conductive means connecting the FM tuner with the emitter electrode to inject FM-IF signals, second conductive means connecting the AM-RF amplifier to the base electrode to introduce AM-RF signals thereto, a separate oscillator connected to said base electrode to provide waves to beat with the AM-RF signals and produce an IF signal, said combination stage operating as a common emitter stage during AM operation and as a common base stage during FM operation without any mechanical switching, and a further amplifying stage including a second transistor having a base, emitter and collector electrodes acting as a common IF amplifier for both AM and FM signals, a first resonant circuit tuned to the FM intermediate frequency connected between the collector electrode of the first transistor and the emitter electrode of the second transistor to introduce FM-IF signals thereto, a second resonant tuned circuit tuned to the AM-IF frequency connected between the collector electrode of the first transistor and the base electrode of the second transistor to introduce AM-IF signals thereto, said further amplifying stage operating in a common emitter mode for AM signals and a common base mode for FM signals and an output circuit connected to the collector electrode of the second transistor.

References Cited by the Examiner

UNITED STATES PATENTS

| | | | |
|---|---|---|---|
| 2,516,272 | 7/50 | Thompson | 325—315 |
| 2,691,074 | 10/54 | Eberhard | 330—30 |
| 2,773,178 | 12/56 | Abbe | 325—443 |
| 3,068,415 | 12/62 | Johnson | 330—27 |

FOREIGN PATENTS

| | | |
|---|---|---|
| 1,121,658 | 1/62 | Germany. |

DAVID G. REDINBAUGH, *Primary Examiner.*